(12) United States Patent
Davies et al.

(10) Patent No.: US 10,116,260 B2
(45) Date of Patent: Oct. 30, 2018

(54) VCO SELECTION AND AMPLITUDE MANAGEMENT USING CENTER TAP INDUCTOR

(71) Applicant: International Business Machines Corporation, Armonk, NY (US)

(72) Inventors: Andrew D. Davies, Rochester, MN (US); David M. Friend, Rochester, MN (US); Christopher W. Steffen, Rochester, MN (US); James D. Strom, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/971,756

(22) Filed: Dec. 16, 2015

(65) Prior Publication Data
US 2017/0179884 A1  Jun. 22, 2017

(51) Int. Cl.
*H03B 5/08* (2006.01)
*H03B 5/18* (2006.01)
*H03B 5/12* (2006.01)

(52) U.S. Cl.
CPC ......... *H03B 5/1228* (2013.01); *H03B 5/1212* (2013.01); *H03B 5/1225* (2013.01); *H03B 5/1256* (2013.01)

(58) Field of Classification Search
CPC .. H03B 5/1256; H03B 5/1228; H03B 5/1225; H03B 5/1212
USPC ...... 331/2, 46, 56, 117 R, 117 FE, 167, 185, 331/186
See application file for complete search history.

(56) References Cited

U.S. PATENT DOCUMENTS

| | | | |
|---|---|---|---|
| 6,859,112 B2* | 2/2005 | Mason | H03B 5/1228 331/117 FE |
| 6,876,263 B1* | 4/2005 | Li | H03B 5/06 331/16 |
| 7,026,883 B2* | 4/2006 | Muthali | H03B 5/04 331/109 |
| 7,764,129 B1 | 7/2010 | Wong et al. | |
| 8,067,992 B2* | 11/2011 | Chen | H03K 3/011 331/111 |
| 8,154,351 B2* | 4/2012 | Tadjpour | H03L 7/104 331/14 |
| 8,779,865 B2* | 7/2014 | Ainspan | H03L 7/099 331/117 FE |
| 9,083,349 B1 | 7/2015 | Townsend et al. | |
| 2003/0146795 A1* | 8/2003 | Albon | H03B 5/1228 331/36 C |
| 2009/0051443 A1* | 2/2009 | Illegems | H03K 3/011 331/57 |
| 2010/0214026 A1* | 8/2010 | Sen | H03B 5/1852 331/8 |
| 2010/0244968 A1* | 9/2010 | Tsukizawa | H03L 1/022 331/17 |
| 2014/0266479 A1* | 9/2014 | Rong | H03B 5/1228 331/117 FE |

(Continued)

*Primary Examiner* — Richard Tan
(74) *Attorney, Agent, or Firm* — Patterson + Sheridan, LLP

(57) ABSTRACT

A system includes a voltage controlled oscillator (VCO) having an adjustable amplitude. The amplitude of the VCO may be adjusted by adjusting voltage level present at a center tap node of an inductor. The VCO may have an adjustable amplitude that may be programmed on a chip-by-chip basis based on a chip parameter, power consumption, or oscillator performance.

14 Claims, 4 Drawing Sheets

(56) References Cited

U.S. PATENT DOCUMENTS

2014/0292301 A1\* 10/2014 Lee .................... H03B 5/1228
  323/299
2015/0015346 A1\* 1/2015 Jou ........................ H03J 5/246
  334/55

\* cited by examiner

VCO SELECTION AND AMPLITUDE MANAGEMENT USING CENTER TAP INDUCTOR

I. FIELD OF THE DISCLOSURE

The present disclosure relates generally to circuitry, and more particularly, to circuitry for selecting a voltage controlled oscillator of a phase lock loop.

II. BACKGROUND

A phase lock loop (PLL) is a control system that generates an output signal having a phase that is related to a phase of an input signal. PLLs may include multiple voltage controlled oscillators (VCOs) to support multiple frequency ranges. A VCO having a desired frequency range may be selected by a selection device, such as a footer device.

The selection device does not contribute to oscillation, yet adds to manufacturing costs and parasitic resistance. Moreover, extreme frequencies (e.g., above 22 GHz) may result in high resistance in the contacts, vias, and wires of a VCO. The frequency extremes may also result in startup problems. For example, a VCO may fail to initiate oscillation.

III. SUMMARY OF THE DISCLOSURE

According to a particular embodiment, an apparatus includes a voltage controlled oscillator and an inductor connected to the voltage controlled oscillator. The inductor includes a center tap connection. A center tap voltage present at the center tap connection affects an oscillation of the voltage controlled oscillator.

An embodiment may include a second voltage controlled oscillator connected to a second inductor having a second center tap connection. An amplitude of the voltage controlled oscillator may be adjustable using the center tap connection.

The voltage supplied to the voltage controlled oscillator may be determined on a chip-by-chip basis based on chip parameter. According to another embodiment, the voltage supplied to the voltage controlled oscillator may be determined based on whether the voltage controlled oscillator initiates oscillating. According to another embodiment, the power supplied to the voltage controlled oscillator is determined at a near minimal level to initialize the voltage controlled oscillator.

Adjustment of a power supply to the voltage controlled oscillator may not adjust power to another device on a microchip with the voltage controlled oscillator. The apparatus of an embodiment includes a reference voltage source connected to the center tap connection. A system power supply may be distinct from the reference voltage supply. Power provided by the reference voltage source may be less than that of a power supply source on which the voltage controlled oscillator resides.

The apparatus of an embodiment includes an operational amplifier connected to the voltage controlled oscillator and a phase lock loop. The voltage supplied to the voltage controlled oscillator may be automatically determined.

According to another embodiment, a method includes providing a voltage controlled oscillator and providing a voltage at a center tap connection of an inductor. The inductor may be connected to the voltage controlled oscillator. The voltage at the center tap connection affects an oscillation of the voltage controlled oscillator.

According to another embodiment, a computer-readable storage device stores computer-executable instructions, that when executed by at least one processor, cause the at least one processor to initiate providing a voltage at a center tap connection of an inductor that is connected to an voltage controlled oscillator. The voltage at the center tap connection affects an oscillation of the voltage controlled oscillator. The provided voltage may be determined based on at least one of: a microchip parameter, power consumption, and voltage controlled oscillator performance.

Features and other benefits that characterize embodiments are set forth in the claims annexed hereto and forming a further part hereof. However, for a better understanding of the embodiments, and of the advantages and objectives attained through their use, reference should be made to the Drawings and to the accompanying descriptive matter.

IV. BRIEF DESCRIPTION OF THE DRAWINGS

V. DETAILED DESCRIPTION

Figure 1:
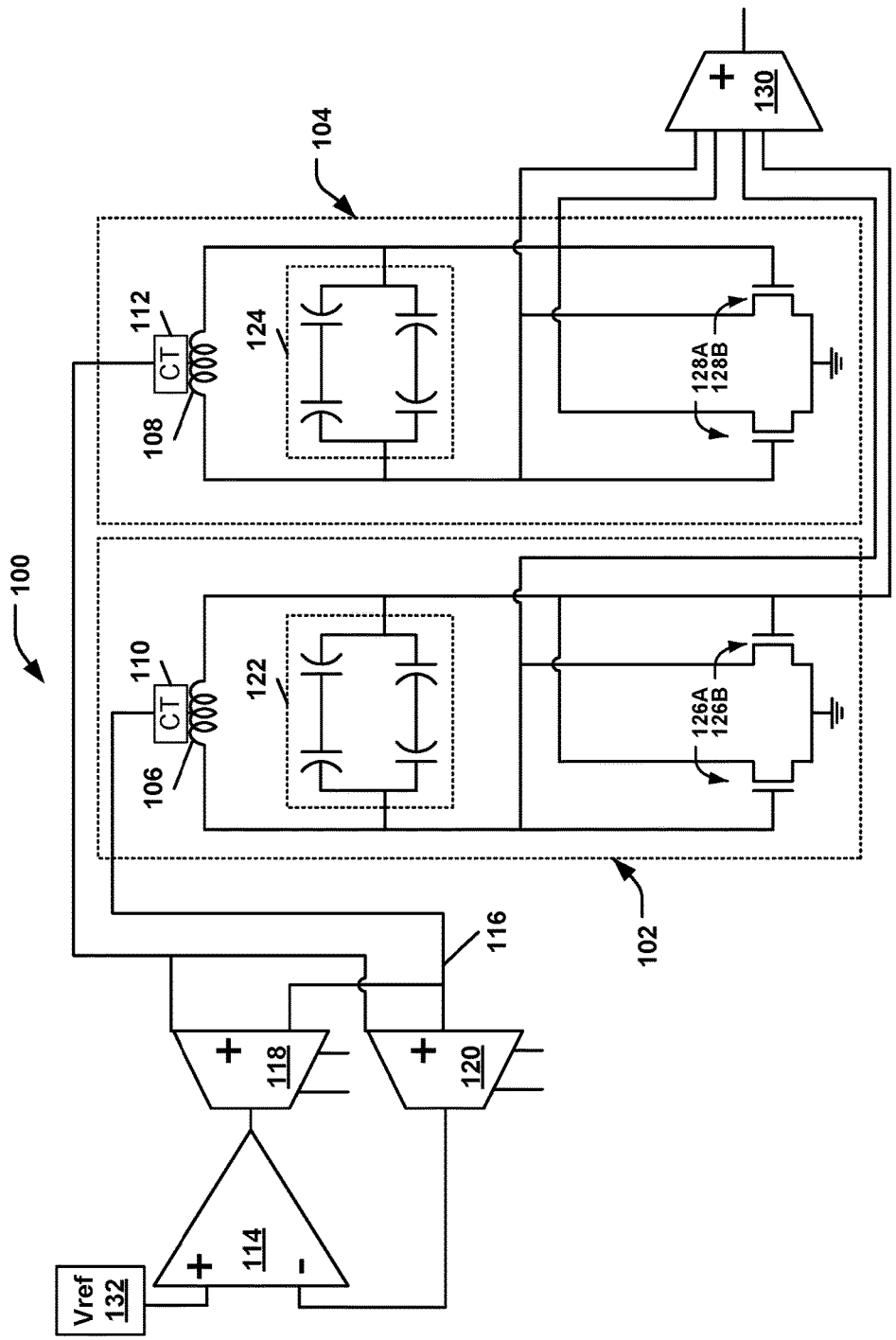
FIG. 1 illustrates a circuit diagram of an embodiment of a system that includes a center tap node of an inductor to select a VCO.

In the present disclosure, an embodiment of a system includes a voltage controlled oscillator (VCO) having an adjustable amplitude. The amplitude of the VCO may be adjusted by adjusting a voltage level present at a center tap node of an inductor. According to another particular embodiment, the VCO may have an adjustable amplitude that may be programmed on a chip-by-chip basis based on a chip parameter. According to another particular embodiment, a VCO has an adjustable amplitude that is amplitude programmed based on whether or not the VCO starts. According to another particular embodiment, a VCO may be optimized for minimum power on a chip-by-chip basis.

According to a particular embodiment, a PLL system includes multiple voltage controlled oscillators (VCOs). Each VCO may include an inductor (L) and a varactor (Cv), collectively abbreviated as LCVCO. The PLL system may have two LCVCOs from which to select. Startup of the LCVCOs may not be comprised by dedicated footer or other selection circuitry used to select between the LCVCOs. The system may, instead, use a center tap connection of the LCVCO to achieve improved startup, amplitude, and jitter performance characteristics.

An embodiment of the system may control center tap nodes to select or deselect LCVCOs. The center tap selection enables better start up for PLLs by not requiring a footer device that is dedicated to disabling a LCVCO. The absence of a footer device lowers the resistance in the system and improves the start up of the LCVCO. Moreover, the localized adjustment of the VCO using the adjustable center tap voltage puts less strain on an entire system than adjusting a power supply that will affect all circuitry in the system.

The center tap connection of the inductor may be controlled by a VCO select signal. The LCVCO that is selected has its center tap connection pulled to approximately one half of the power supply, while the deselected LCVCO is allowed to charge to ground. Allowing the deselected LCVCO to charge to ground will effectively turn the deselected LCVCO off, thereby limiting noise. The center tap connection capitalizes on the layout of the inductor that comprises higher levels of metal that have low resistivity.

Feedback for the operational amplifier may be picked up at the center tap connection of the inductor. Reception of the feedback allows the operational amplifier to compensate for a resistance drop in the path to the center tap connection. The compensation improves voltage applied to the oscillator.

The operational amplifier that controls the center tap connection may have its reference voltage raised or lowered. Adjusting the reference voltage provides more or less voltage to the transistors in the LCVCO and increases or decreases the oscillation amplitude. Increasing the current and voltage and gain to the transistors in the LCVCO may increase the amplitude and thus improve the start up. Increasing the amplitude of the LCVCO may result in desired jitter performance characteristics.

Turning more particularly to the Drawings, FIG. 1 illustrates a circuit diagram of an embodiment of a system 100 that includes a first and second LCVCOs 102, 104. The LCVCOs 102, 104 are designed to each include an inductor 106, 108 having a center tap (CT) connection 110, 112. The center tap connection 110, 112 of each inductor 106, 108 may be connected to an operational amplifier 114. The center connections 110, 112 may be thick and robust with less resistance than conventional footers. Operational amplifier feedback 116 may be input through pass gate multiplexers 118, 120. The system 100 further includes varactors 122, 124, field effect transistors (FETs) 126, 128, and a multiplexor 130.

A reference voltage circuit 132 may be connected to a reference input of the operational amplifier 114. The amplitude of the LCVCOs 102, 104 may be adjusted by adjusting the reference voltage. Thus, oscillation may be controlled based on how the center tap voltage is biased. The reference circuit 132 of an example may be at about one half of a power supply of a microchip on which the system 100 resides. In another example, the reference voltage circuit 132 may be adjusted to other settings to increase the amplitude of the LCVCOs 102, 104 by raising the reference voltage. The reference voltage may provide more voltage to the devices in the LCVCOs 102, 104 to transition signals into the linear region. In this manner, the voltage may be selectively increased at the LCVCOs 102, 104 without affecting the voltage at other devices receiving power from the power supply. Put another way, the localized adjustment of a VCO is enabled using the adjustable center tap voltage, as opposed to adjusting a system-wide power supply that affects all circuitry in a system.

Firmware and software implementations may be used where advantageous. According to an embodiment, the center tap voltage may be preprogrammed or automatically programmed in real time. For example, if oscillation is determined to be slow (e.g., using empirical data or a sensor in real time), the voltage at the center tap may be increased. Tables storing hardware parameters, sensors, and feedback loops may be used by a processor to set the voltage at the center tap. The reference voltage of an embodiment may be scaled back to conserve power.

Figure 2:
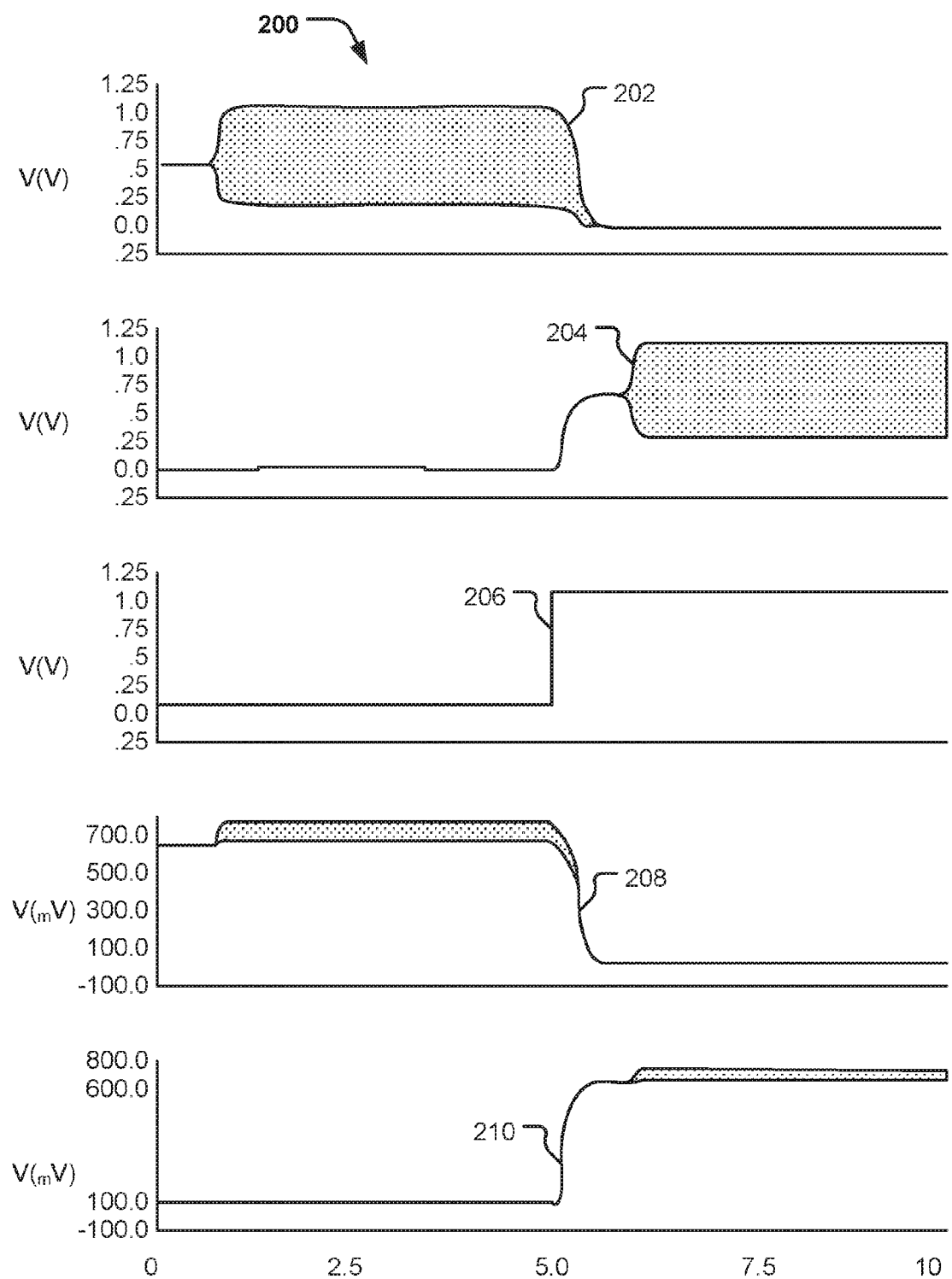
FIG. 2 shows corresponding plots of voltage over time for a low frequency VCO, a high frequency VCO, a VCO select signal, a low frequency center tap connection, and a high frequency center tap voltage connection.

FIG. 2 shows corresponding plots 202, 204, 206, 208, 210 of voltage over time for a low frequency LCVCO, a high frequency LCVCO, a VCO select signal, a low frequency center tap connection, and a high frequency center tap connection, respectively. The voltage curve 204 of a high frequency LCVCO oscillates when the VCO select signal 206 is high. The VCO select signal 206 being high connects an operational amplifier to the high frequency center tap connection. When the VCO select signal 206 goes high, the high frequency center tap connection 210 is connected to the operational amplifier, and the low frequency center tap connection 208 is disconnected. When the VCO select signal 206 goes low, the low frequency LCVCO signal 202 oscillates because the low frequency center tap connection 208 is biased at approximately 0.5 V. The high frequency center tap connection 210 is caused to fall, and consequently, the high frequency LCVCO signal 204 is turned off.

Figure 3:
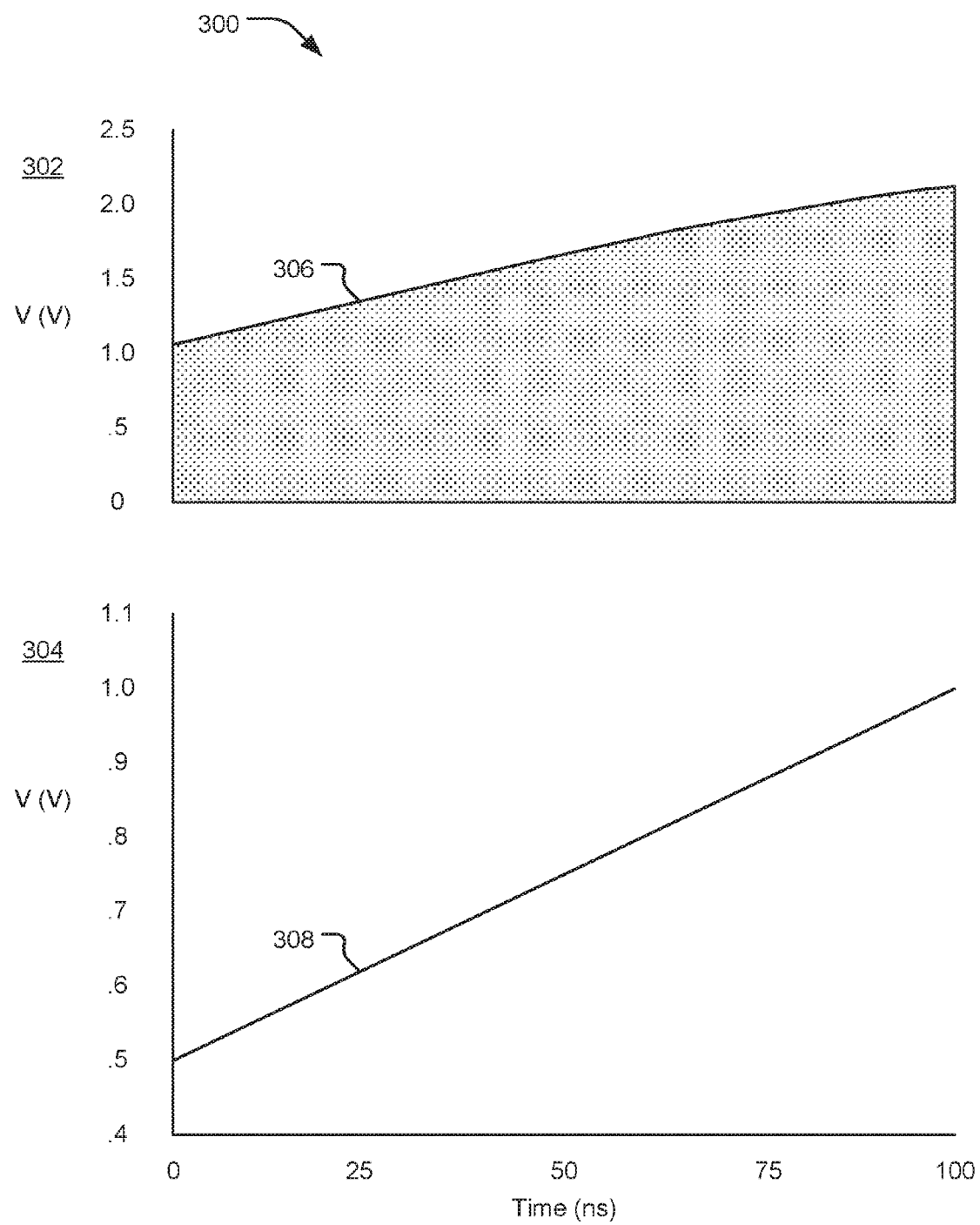
FIG. 3 shows corresponding graphs charting voltage over time for both an LCVCO and a reference voltage.

FIG. 3 shows corresponding graphs 302, 304 charting voltage over time for both an LCVCO and a reference voltage. The graphs 302, 304 show how the voltage 306 of an LCVCO may be adjusted by adjusting the reference voltage 308.

Figure 4:
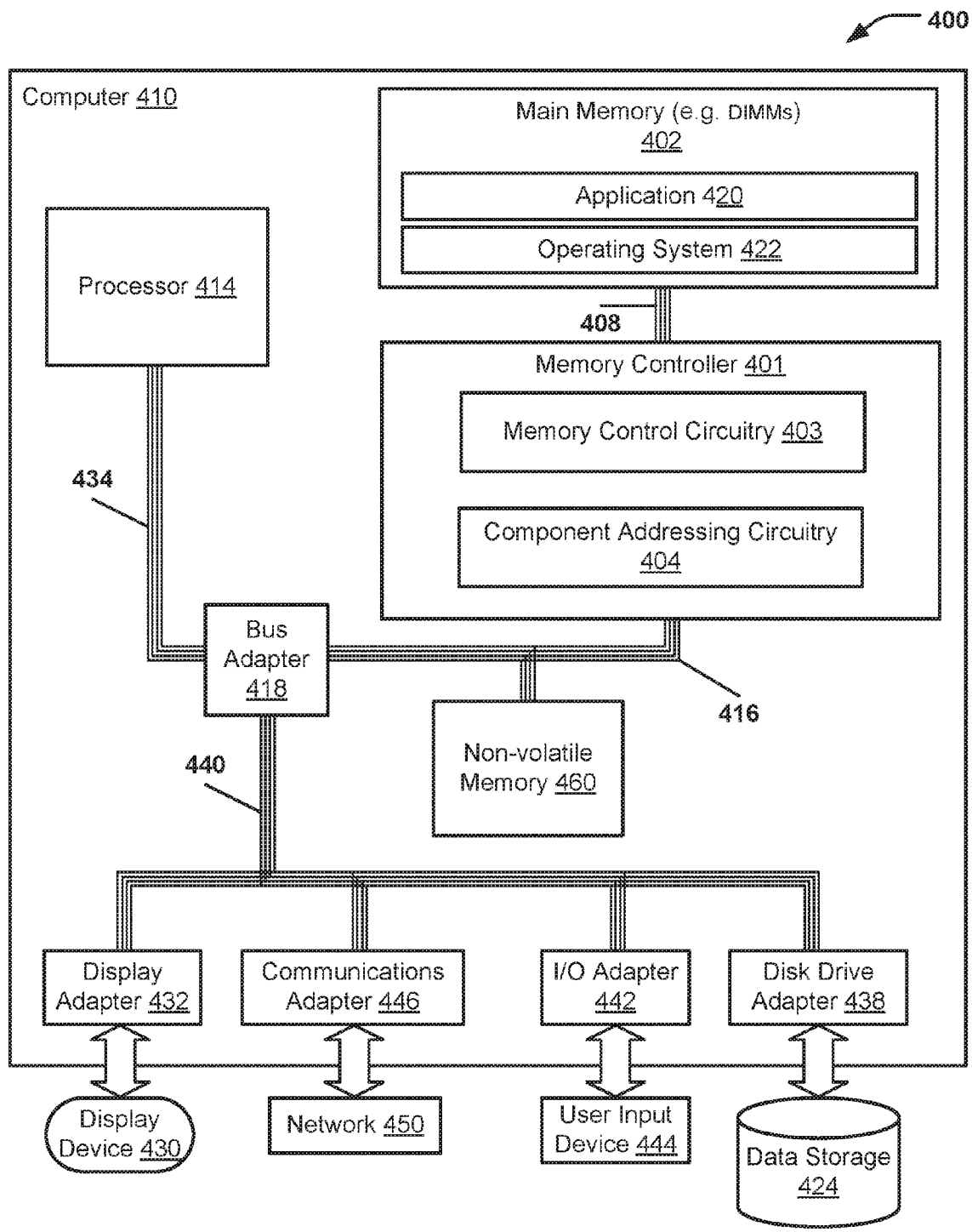
FIG. 4 is a block diagram showing a general computing system for testing charge trap memory cells according to a particular embodiment.

Referring to FIG. 4, an illustrative system 400 including a computer 410 is shown. The computer 410 may be an implementation of a computing system that includes the system 100 of FIG. 1. The computer 410 includes at least one computer processor (CPU) 414 as well as main memory 402, a memory controller 401, and a non-volatile memory 460. At least one of the main memory 402 or the non-volatile memory 460 may include the system 100 of FIG. 1. In some implementations, the memory controller 401 may include one or more components of the system 100 of FIG. 1. The main memory 402 is connected through a memory bus 408 to the memory controller 401. The memory controller 401 and the non-volatile memory 460 are connected through a second memory bus 416 and a bus adapter 418 to the processor 414 through a processor bus 434.

Stored at the memory 402 is an application 420 that may be a module of user-level computer program instructions for carrying out particular tasks (e.g., determining and adjusting voltage amplitudes of VCOs). Also stored at the main memory 402 is an operating system 422. Operating systems include, but are not limited to, UNIX® (a registered trademark of The Open Group), Linux® (a registered trademark of Linus Torvalds), Windows® (a registered trademark of Microsoft Corporation, Redmond, Wash., United States), AIX® (a registered trademark of International Business Machines (IBM) Corp., Armonk, N.Y., United States) i5/OS® (a registered trademark of IBM Corp.), and others as will occur to those of skill in the art. The operating system 422 and the application 420 in the example of FIG. 4 are shown in the main memory 402, but components of the aforementioned software may also, or in addition, be stored at non-volatile memory (e.g., on data storage, such as data storage 424 and/or the non-volatile memory 460).

The computer 410 includes a disk drive adapter 438 coupled through an expansion bus 440 and the bus adapter 418 to the processor 414 and other components of the computer 410. The disk drive adapter 438 connects non-volatile data storage to the computer 410 in the form of the data storage 424 and may be implemented, for example, using Integrated Drive Electronics ("IDE") adapters, Small Computer System Interface ("SCSI") adapters, Serial Attached SCSI ("SAS") adapters, and others as will occur to those of skill in the art. Non-volatile computer memory also may be implemented as an optical disk drive, electrically erasable programmable read-only memory (so-called "EEPROM" or "Flash" memory), RAM drives, and other devices, as will occur to those of skill in the art. In a particular embodiment, the data storage 424 may store the data and information described herein.

The computer 410 also includes one or more input/output ("I/O") adapters 442 that implement user-oriented input/output through, for example, software drivers and computer hardware for controlling input and output to and from user input devices 444, such as keyboards and mice. In addition, the computer 410 includes a communications adapter 446 for data communications with a data communications network 450. The data communications may be carried out serially through Recommended Standard 432 (RS-232) connections (sometimes referred to as "serial" connections), through external buses such as a Universal Serial Bus ("USB"), through data communications networks such as internet protocol (IP) data communications networks, and in other ways as will occur to those of skill in the art. The communications adapter 446 implements the hardware level of data communications through which one computer sends data communications to another computer, directly or through a data communications network. Examples of the communications adapter 446 suitable to use in the computer 410 include, but are not limited to, modems for wired dial-up communications, Ethernet (Institute of Electrical and Electronics Engineers (IEEE) 802.3) adapters for wired network communications, and IEEE 802.11 adapters for wireless network communications. The computer 410 also includes a display adapter 432 that facilitates data communication between the bus adapter 418 and a display device 430, enabling the application 420 to visually present output on the display device 430.

Particular embodiments described herein may take the form of an entirely hardware embodiment, an entirely software embodiment, or an embodiment containing both hardware and software elements. In a particular embodiment, the disclosed methods are implemented in software that is embedded in processor readable storage medium and executed by a processor that includes but is not limited to firmware, resident software, microcode, etc.

Further, embodiments of the present disclosure, may take the form of a computer program product accessible from a computer-usable or computer-readable storage medium providing program code for use by or in connection with a computer or any instruction execution system. For the purposes of this description, a computer-usable or computer-readable storage medium may be any apparatus that may tangibly embody a computer program and that may contain, store, communicate, propagate, or transport the program for use by or in connection with the instruction execution system, apparatus, or device.

In various embodiments, the medium may include an electronic, magnetic, optical, electromagnetic, infrared, or semiconductor system (or apparatus or device) or a propagation medium. Examples of a computer-readable storage medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and digital versatile disk (DVD).

A data processing system suitable for storing and/or executing program code may include at least one processor coupled directly or indirectly to memory elements through a system bus. The memory elements may include local memory employed during actual execution of the program code, bulk storage, and cache memories that may provide temporary or more permanent storage of at least some program code in order to reduce the number of times code must be retrieved from bulk storage during execution.

Input/output or I/O devices (including but not limited to keyboards, displays, pointing devices, etc.) may be coupled to the data processing system either directly or through intervening I/O controllers. Network adapters may also be coupled to the data processing system to enable the data processing system to become coupled to other data processing systems or remote printers or storage devices through intervening private or public networks. Modems, cable modems, and Ethernet cards are just a few of the currently available types of network adapters.

The previous description of the disclosed embodiments is provided to enable any person skilled in the art to make or use the disclosed embodiments. Various modifications to these embodiments will be readily apparent to those skilled in the art, and the generic principles defined herein may be applied to other embodiments without departing from the scope of the disclosure. Thus, the present disclosure is not intended to be limited to the embodiments shown herein but is to be accorded the widest scope possible consistent with the principles and features as defined by the following claims.

The invention claimed is:

1. An apparatus comprising:
a first voltage controlled oscillator (VCO) that includes a first inductor, a first varactor, a first transistor, and a second transistor, wherein the first inductor is coupled to the first varactor, the first transistor and the second transistor; wherein the first inductor includes a first center tap connection; and wherein a center tap voltage at the first center tap connection affects an oscillation of the first VCO;
a second VCO that includes a second inductor having a second center tap connection, a pair of transistors coupled to the second inductor, and a second varactor;
an operational amplifier, wherein an output of the operational amplifier is coupled to the first center tap connection of the first inductor;
a first multiplexer receiving an output from the operational amplifier, the first multiplexer coupled to the first and second center tap connections; and
a second multiplexer providing an input to the operational amplifier, the second multiplexer coupled to the first and second center tap connections,
wherein a selection signal is used to select between the second VCO and the first VCO.

2. The apparatus of claim 1, wherein the pair of transistors each include a gate.

3. The apparatus of claim 1, wherein an amplitude of the first VCO is adjustable by adjusting the center tap voltage at the first center tap connection.

4. The apparatus of claim 1, wherein a supply voltage supplied to the first VCO via the operational amplifier is determined based on a microchip parameter.

5. The apparatus of claim 1, wherein a supply voltage supplied to the first VCO via the operational amplifier is determined based on whether the first VCO fails to oscillate.

6. The apparatus of claim 1, wherein a supply voltage supplied to the first VCO via the operational amplifier is supplied to initialize oscillation of the first VCO.

7. The apparatus of claim 1, wherein adjustment of a supply voltage supplied to the first VCO via the operational amplifier does not adjust a voltage level power to another device on a microchip that includes the first VCO.

8. The apparatus of claim 1, further comprising a reference voltage supply coupled to the first center tap connection via the operational amplifier.

9. The apparatus of claim 8, further comprising a system power supply distinct from the reference voltage supply.

10. The apparatus of claim 9, wherein power provided by the reference voltage supply is less than power of the system power supply.

11. The apparatus of claim 9, wherein a voltage of the reference voltage supply is less than a voltage of the system power supply.

12. The apparatus of claim 1, wherein a supply voltage supplied to the first VCO via the operational amplifier is programmatically determined.

13. The apparatus of claim 1, wherein the first inductor is coupled to a gate of the first transistor and to a gate of the second transistor, wherein the first transistor is a field effect transistor (FET), and wherein the second transistor is a FET.

14. The apparatus of claim 1, wherein the second multiplexer functions as a pass gate.

\* \* \* \* \*